US006096459A

United States Patent [19]

Yang

[11] Patent Number: 6,096,459

[45] Date of Patent: Aug. 1, 2000

[54] METHOD FOR REPAIRING ALTERNATING PHASE SHIFTING MASKS

[75] Inventor: Baorui Yang, Pflugerville, Tex.

[73] Assignee: Micron Technology, Inc., Boise, Id.

[21] Appl. No.: 09/220,893

[22] Filed: Dec. 28, 1998

[51] Int. Cl.[7] .......... G03F 9/00

[52] U.S. Cl. .......... 430/5; 216/62

[58] Field of Search .......... 430/5, 322, 323; 216/62, 66; 378/35

[56] References Cited

U.S. PATENT DOCUMENTS

| | | | |
|---|---|---|---|
| 4,851,097 | 7/1989 | Hattori et al. | 204/192.33 |
| 5,035,787 | 7/1991 | Parker et al. | 204/192.34 |
| 5,085,957 | 2/1992 | Hosono | 430/5 |
| 5,165,954 | 11/1992 | Parker et al. | 437/526 |
| 5,246,801 | 9/1993 | Pierrat | 430/5 |
| 5,272,116 | 12/1993 | Hosono | 437/228 |
| 5,357,116 | 10/1994 | Talbot et al. | 250/492.21 |
| 5,382,484 | 1/1995 | Hosono | 430/5 |
| 5,405,721 | 4/1995 | Pierrat | 430/5 |
| 5,576,126 | 11/1996 | Rolfson | 430/5 |
| 5,582,939 | 12/1996 | Pierrat | 430/5 |
| 5,635,315 | 6/1997 | Mitsui | 430/5 |
| 5,695,896 | 12/1997 | Pierrat | 430/5 |
| 5,759,724 | 6/1998 | Rolson | 430/5 |
| 5,795,685 | 8/1998 | Liebmann et al. | 430/5 |
| 5,965,301 | 10/1999 | Nara et al. | 430/5 |

OTHER PUBLICATIONS

Y. Satoh et al., "Performance of Gas Assist FIB Repair for Opaque Defects", SPIE, vol. 2884, pp. 124–137.

Seiko Instrument, Inc. Scientific Instrument Division, SIR–3000, Photomask Repair System, Operation Manual.

*Primary Examiner*—S. Rosasco

*Attorney, Agent, or Firm*—Dickstein Shapiro Morin & Oshinsky, LLP

[57] ABSTRACT

A method of repairing quartz bump defects on an alternating phase shifting template such as a mask or reticle that includes the steps of locating a defect by either SEM scanning or low energy FIB scanning; directing a FIB at the bump defect, and irradiating the bump detect with high energy ions from the FIB. After the bump has been thoroughly stained with ions, the template is exposed to a strongly basic solution to remove the stained bump. Suitable bases include sodium hydroxide, potassium hydroxide, ammonium hydroxide, to tetramethyl ammonium hydroxide, and the like. According to this method, a quartz bump defect is removed with high precision and less damage to the substrate.

31 Claims, 2 Drawing Sheets

METHOD FOR REPAIRING ALTERNATING PHASE SHIFTING MASKS

FIELD OF THE INVENTION

The present invention relates generally to a method for repairing a template used in optical lithography, and in particular to a method for repairing quartz bump defects on an alternating phase shifting template, such as a mask or reticle, which is used in a lithographic process for the manufacture of semiconductor elements.

BACKGROUND OF THE INVENTION

In the manufacture of semiconductor wafers, microlithography is used to pattern various layers on a wafer. A layer of resist is deposited on the wafer and exposed using an exposure tool and a template such as a mask or reticle. During the exposure process a form of radiant energy such as ultraviolet light is directed through the template to selectively expose the resist in a desired pattern. The resist is then developed to remove either the exposed portions for a positive resist or the unexposed portions for a negative resist, thereby forming a resist mask on the wafer. The resist mask can then be used to protect underlying areas of the wafer during subsequent fabrication processes, such as deposition, etching, or ion implantation processes.

Manufacturers in the field of integrated circuits (ICs) have been trying to reduce the geometric size of the devices (e.g., transistors or polygates) present on integrated circuits. The benefits achieved by reducing device dimensions include higher performance and smaller packaging sizes. Improving lithographic techniques provides improved resolution and results in a potential reduction of the minimum dimension. However, at small geometries, diffraction effects such as proximity effects, poor subject contrast, and poor resolution result, producing wafers with incomplete or erroneous circuit patterns.

A lithographic technique useful at small geometries is known as phase shifting lithography. In phase shifting lithography, the interference between waves of an exposure energy is used to overcome diffraction effects and to improve the resolution and depth of optical images projected onto a target. Phase shifting lithography involves controlling the phase of an exposure light at the target such that adjacent bright areas are formed preferably 180 degrees out of phase with one another. Dark regions are thus produced between the bright areas by destructive interference even when diffraction would otherwise cause these areas to be lit. This technique improves total resolution at the target (i.e., wafer) and allows resolutions as fine as 0.10 microns to occur.

In the past, phase shifting templates have been used experimentally to print submicron features. Phase shifting lithography is still in the research and development stage, however, and has not been used extensively for commercial volume semiconductor manufacture. One reason phase shifting lithography is not widely used commercially is the high defect density which results during template manufacture. Phase shifting templates are difficult to form without defects and any defects on the template may be printed onto the target. In addition, an individual reticle costs in the range of $10,000 to $20,000 and typically requires up to two weeks to manufacture. Mask production likewise involves substantial time and expense. The complete circuit patterning for a modern IC will typically require 10 to 20 or more reticles.

Some of the most common alternating phase shifting template defects are substrate defects of two types: quartz bumps and quartz divots. Alternating phase shifting reticles and masks typically consist of an opaque thin film of metal, such as chromium, deposited in a pattern of lines and spaces on a transparent substrate of quartz, glass, or fused silica. A phase shifting layer is patterned between every other opaque line. A quartz bump comprises unwanted quartz or glass that has been deposited or not removed from a region of the template. A quartz divot comprises an area of the template substrate that has been undesirably removed by etching or other means. Either type of defect may lead to printing errors on a target such as a semiconductor wafer.

Focused ion beams (FIBs) have been used for repair of optical masks and reticles since the mid-1980s. The ability of the FIB to accurately remove unwanted portions of the metal film and to deposit material to "edit" the pattern makes it potentially an almost ideal repair tool. A FIB exposes a template to a beam of positively charged ions, typically gallium ions, via an optic system. Sputtering with a scanning FIB is the preferred method of quartz bump defect repair at small geometries, but FIB sputtering has several disadvantages. One disadvantage is the formation of a trench called a "riverbed" around the bump due to ion scattering off the edges of the bump. Another disadvantage of FIB sputtering is the tendency of the beam to drift during periods of prolonged sputtering due to charge-up on the substrate surface and the metal film.

There is needed, therefore, a method of repairing quartz bump defects on an alternating phase shifting template that reduces or prevents riverbed formation, and that reduces damage due to beam drifting.

SUMMARY OF THE INVENTION

The present invention provides a method for repairing quartz bump defects on a lithographic template by focused ion beam sputtering, followed by wet etching. A template containing a quartz bump to be removed is scanned with a high energy focused gallium ion beam to implant gallium ions into the bump. The template is then exposed to a strong base to remove the bump from the template surface. The strong base may be sodium hydroxide, ammonium hydroxide or the like, but is preferably sodium hydroxide. Due to the presence of gallium ions in the material of the bump, the bump is etched at a much faster rate than is the template substrate.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention. The following detailed description is, therefore, not to be taken in a limiting sense, and the scope of the present invention is defined by the appended claims.

Figure 1:
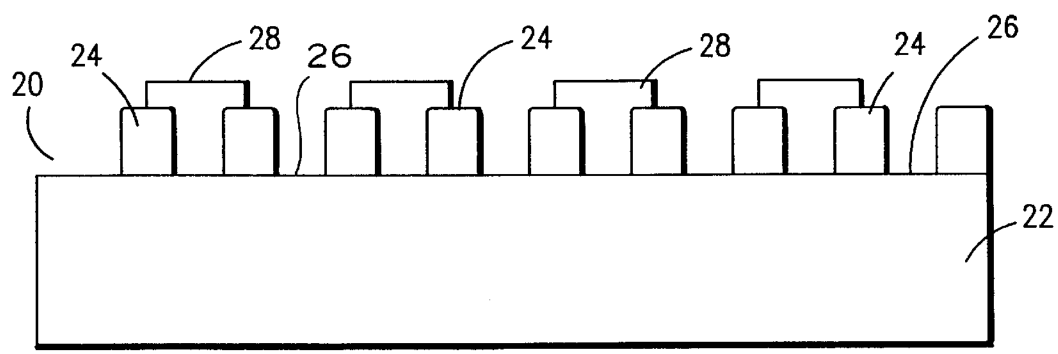
FIG. 1 is a cross-sectional view of a representative lithographic template.

Referring now to the drawings, where like elements are designated by like reference numerals, an exemplary lithographic template 20 is shown in FIG. 1. The lithographic template 20 may be a photomask, x-ray mask, reticle, or other similar structure having similar features. The lithographic template comprises a transparent substrate 22, an opaque portion 24 formed and patterned on the transparent substrate 22, and light transmitting portions 26 and 28. The transparent substrate 22 is made of silica glass, fused silica, borosilicate glass, quartz, or the like, and is typically a 6 by 6 inch square having a thickness of approximately 0.25 inches, although the size and thickness may vary. The opaque portion 24 is typically made of a chromium-containing material such as chromium oxide or chrome.

The depth of the light transmitting portion 28 is adjusted depending on the composition of the light transmitting portion 28 so that phase shifting within the range of 160 to 200 degrees is achieved. Preferably, the phase shifting amount is 180 degrees. The depth may be adjusted according to the equation $d=(\phi/360)\times[\lambda/(n-1)]$, where d is the depth of the light transmitting portion 28, $\phi$ is a predetermined phase shifting amount, $\lambda$ is the wavelength of light with which the lithographic template 20 will be used, and n is the refractive index of the material of the light transmitting portion 28.

Figure 2:
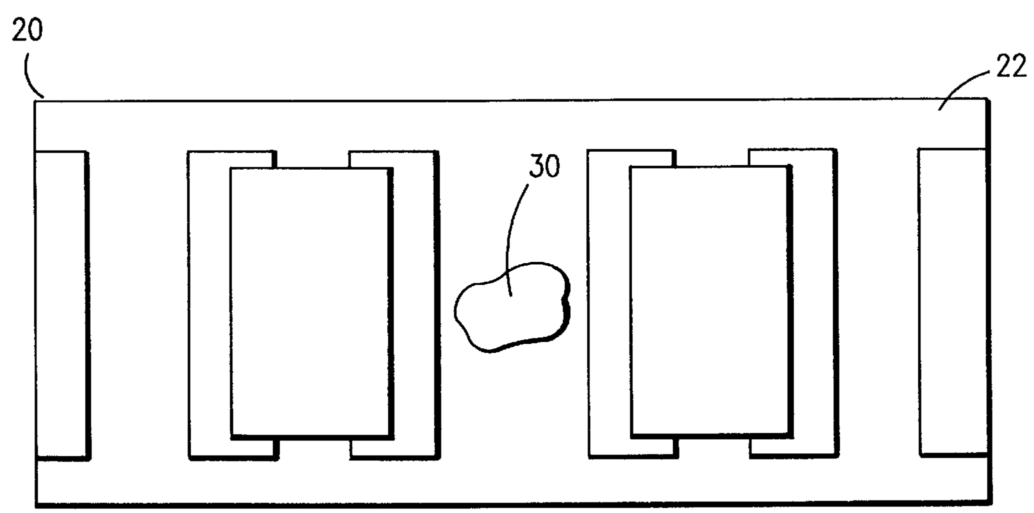
FIG. 2 is a top view of a lithographic template undergoing the process of a preferred embodiment of the invention.
Figure 3:
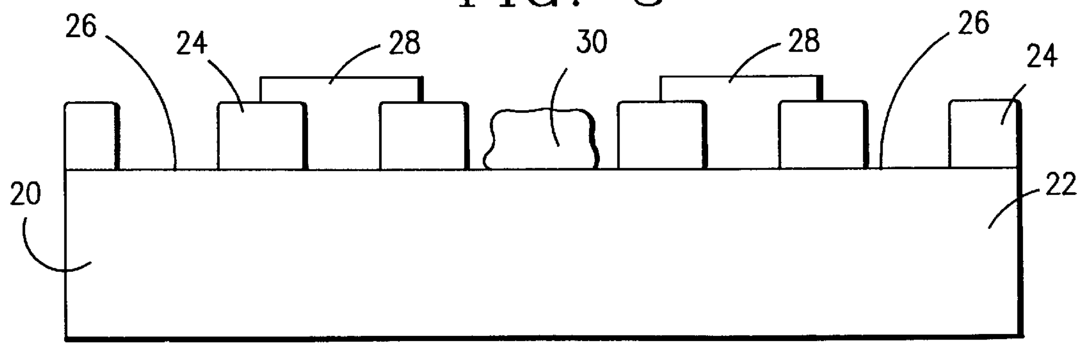
FIG. 3 is a side view of the template of FIG. 2.

A lithographic template 20 having a quartz bump defect 30 thereon is shown in FIGS. 2 and 3. It should be understood that a "quartz bump" may be a bump of quartz, glass, silica or other silicate material. To remove the bump 30, the template 20 is placed in the vacuum chamber (not shown) of a FIB system. Any suitable FIB system may be utilized, as may a combination of a scanning electron microscope (SEM) and a FIB system. The system or combination should be capable of low energy scanning at approximately a few KeV to 30 KeV, and high energy sputtering at approximately 90 to 130 KeV. If a FIB system is used, the low energy beam for imaging minimizes $Ga^+$ stains.

Figures 4, 5:
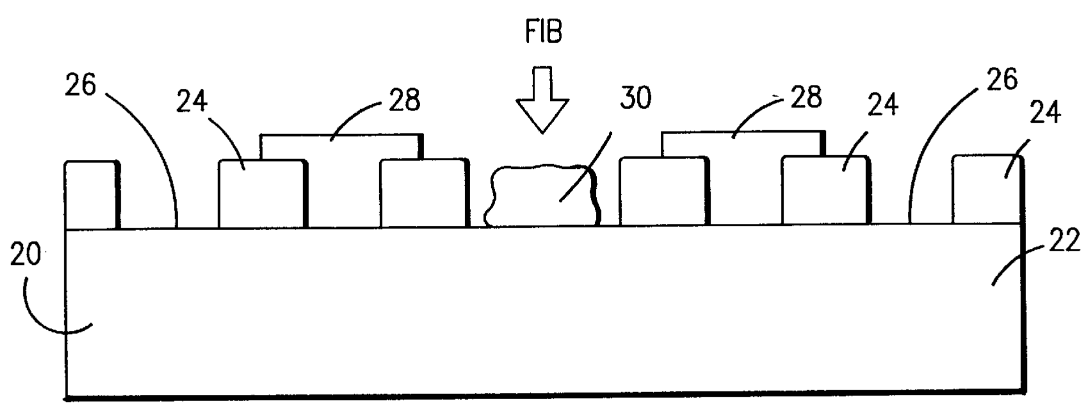
FIG. 4 shows the template of FIG. 2 at a processing step subsequent to that shown in FIGS. 2 and 3.
FIG. 5 shows the template of FIG. 2 at a processing step subsequent to that shown in FIG. 4.

Referring now to FIG. 4, scanning is performed to locate a quartz bump defect 30 on the template 20. Scanning may be performed by a FIB system at a low energy of approximately a few to 30 KeV, or by an SEM. Once the bump 30 is located, a high energy gallium FIB is directed at the bump 30, and sputtering is begun. In the case of repairing a 248 nm alternating phase shifting mask or template, most of the quartz bumps have about an 80 nm height due to the design of the phase shifting mask manufacturing process. Due to the high energy, i.e., about 90 to 110 KeV, the ion beam penetrates approximately 80 nm into the surface of the quartz bump 30, thus permitting rapid gallium staining of the bump 30. After the bump 30 is thoroughly stained, sputtering is stopped. The high energy of the FIB enables extremely rapid staining, thereby reducing riverbed and drift problem that result from the prolonged FIB exposure of a typical repair procedure. In the case of repairing a 193 nm alternating phase shifting mask or template, a lower energy $Ga^+$ beam can be used because the quartz bump is thinner.

The stained bump 30 is then removed by exposing the template 20 to an aqueous solution of a strong base. Suitable bases include sodium hydroxide, potassium hydroxide, ammonium hydroxide, tetramethyl ammonium hydroxide, and the like. Preferably sodium hydroxide is used. The solution should comprise approximately 3 to 4 percent sodium hydroxide in water, or should be of an equivalent strength if another base is used. The sodium hydroxide solution is heated to a temperature of approximately 75 to 85 degrees Celsius, and the template is exposed to this solution by wet etching means such as immersion or spray etching, for a period of time within the range of approximately 1 to 10 minutes. Preferably the temperature is approximately 80 degrees. It should be understood that the exposure time will vary according to the strength of the basic solution utilized. Due to the gallium staining of the bump 30, the material of the bump 30 is etched at a rate approximately four to five times as fast as the etching of the material of the template substrate 22. As can be seen in FIG. 5, the bump 30 has been removed from the surface of the template 20.

As can be seen by the embodiments described herein, the present invention encompasses a quartz bump defect repair method for a lithographic template. The method uses focused ion beam scanning to implant gallium ions into a quartz bump, followed by a treatment with a strong base such as sodium hydroxide to remove the stained bump. This process has the advantage of avoiding the formation of riverbeds and reducing the undesirable effects of beam drift during the FIB process.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method for removing a bump defect from a lithographic template, comprising the steps of:

providing a lithographic template having a substrate layer and a patterned opaque layer on the substrate layer;

locating a bump defect on the template;

directing a high energy focused ion beam at the bump defect for a time sufficient to drive ions into the entirety of the bump defect; and etching the template containing the ion beam implanted bump defect with a basic solution to remove the bump defect.

2. The method of claim 1, wherein the opaque layer comprises a layer of chromium.

3. The method of claim 1, wherein said step of locating a bump defect comprises scanning with a scanning electron microscope.

4. The method of claim 1, wherein said step of locating a bump defect comprises scanning with a low energy focused ion beam.

5. The method of claim 4, wherein said low energy focused ion beam has an acceleration energy of approximately a few KeV to 30 KeV.

6. The method of claim 1, wherein said high energy focused ion beam has an irradiation energy within the range of approximately 90 to 130 KeV.

7. The method of claim 1, wherein the basic solution is a sodium hydroxide solution.

8. The method of claim 1, wherein the basic solution is an ammonium hydroxide solution.

9. The method of claim 1, wherein the basic solution is a potassium hydroxide solution.

10. The method of claim 1, wherein the basic solution is a tetraethylammonium hydroxide solution.

11. The method of claim 1, wherein said etching step comprises immersion etching.

12. The method of claim 1, wherein said etching step comprises spray etching.

13. The method of claim 1, wherein the lithographic template is a mask.

14. The method of claim 1, wherein the lithographic template is a reticle.

15. The method of claim 1, wherein the focused ion beam is a gallium beam.

16. A method for removing a bump defect from a lithographic template, comprising the steps of:

providing a lithographic template having a silicon substrate layer and a patterned opaque layer on the substrate layer; and removing a bump defect on the template by directing a high energy focused gallium ion beam at the entirety of the bump defect and etching the template with a basic solution.

17. The method of claim 16, wherein the basic solution is a sodium hydroxide solution.

18. The method of claim 16, wherein the silicon substrate is a quartz substrate.

19. The method of claim 16, wherein the silicon substrate is a fused silica substrate.

20. The method of claim 16, wherein the silicon substrate is a glass substrate.

21. The method of claim 16, wherein said etching step comprises immersion etching.

22. The method of claim 16, wherein said etching step comprises spray etching.

23. She method of claim 16, wherein the lithographic template is a mask.

24. The method of claim 16, wherein the lithographic template is a reticle.

25. A method for removing a bump defect from a lithographic template, comprising the steps of:

providing a lithographic template having a substrate layer and a patterned opaque layer on the substrate layer;

locating a bump defect on the template by scanning;

directing a high energy focused gallium ion beam at the bump defect for a time sufficient to drive ions into the entirety of the bump defect; and etching the template containing the ion beam implanted bump defect with a basic solution to remove the bump defect.

26. The method of claim 25, wherein the sodium hydroxide solution comprises approximately 3 to 4 percent sodium hydroxide in water.

27. The method of claim 26, wherein the sodium hydroxide solution is at a temperature of approximately 75 to 85 degrees Celsius.

28. The method of claim 26, wherein the sodium hydroxide solution is at a temperature of approximately 80 degrees Celsius.

29. The method of claim 25, wherein said etching step is carried out for a time within the range of approximately 1 to 10 minutes.

30. The method of claim 25, wherein said scanning step comprises scanning with a scanning electron microscope.

31. The method of claim 25, wherein said scanning step comprises scanning with a low energy focused ion beam.

* * * * *